United States Patent
Lim

(10) Patent No.: US 12,119,695 B2
(45) Date of Patent: Oct. 15, 2024

(54) DEVICE AND METHOD FOR DETECTING POOR BATTERY CELL

(71) Applicant: LG CHEM, LTD., Seoul (KR)

(72) Inventor: Bo Mi Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 183 days.

(21) Appl. No.: 17/103,221

(22) Filed: Nov. 24, 2020

(65) Prior Publication Data

US 2021/0194253 A1 Jun. 24, 2021

(30) Foreign Application Priority Data

Dec. 19, 2019 (KR) .................. 10-2019-0171063

(51) Int. Cl.
  *G01R 31/36* (2020.01)
  *G01R 31/3835* (2019.01)
  (Continued)

(52) U.S. Cl.
  CPC .......... *H02J 7/005* (2020.01); *G01R 31/3648* (2013.01); *G01R 31/3835* (2019.01); *H01M 10/441* (2013.01); *H01M 10/46* (2013.01); *H01M 10/482* (2013.01); *H02J 7/0013* (2013.01); *H02J 7/0048* (2020.01); *H02J 7/007182* (2020.01)

(58) Field of Classification Search
  CPC .... H02J 7/005; H02J 7/0048; H02J 7/007182; H02J 7/0013; G01R 31/3835; G01R 31/3648; H01M 10/441; H01M 10/46; H01M 10/482
  See application file for complete search history.

(56) References Cited

U.S. PATENT DOCUMENTS

2002/0011822 A1* 1/2002 Sakai .................. H02J 7/0048
                                                        320/134
2011/0115491 A1    6/2011 Jung et al.
                        (Continued)

FOREIGN PATENT DOCUMENTS

CN      106329643 A   *  1/2017  ............ H02J 7/0014
EP      2 642 307 A1     9/2013
                        (Continued)

OTHER PUBLICATIONS

Zhang, CN-106329643-A Machine Translation, Jan. 2017 (Year: 2017).*

(Continued)

*Primary Examiner* — Drew A Dunn
*Assistant Examiner* — Pamela J Jeppson
(74) *Attorney, Agent, or Firm* — Birch, Stewart, Kolasch & Birch, LLP

(57) ABSTRACT

An ESS capable of detecting a defective battery cell, the ESS in accordance with an exemplary embodiment, may include a plurality of battery cells, and a control unit for controlling the charge/discharge of the ESS, wherein the control unit includes an SOC calculation unit for calculating the SOC of the ESS, a voltage measurement unit for measuring the voltage of each of the plurality of battery (Continued)

cells, and a poor battery cell detection unit for detecting a defective battery cell from the voltages measured in the voltage measurement unit.

8 Claims, 2 Drawing Sheets

(51) Int. Cl.
*H01M 10/44* (2006.01)
*H01M 10/46* (2006.01)
*H01M 10/48* (2006.01)
*H02J 7/00* (2006.01)

(56) References Cited

U.S. PATENT DOCUMENTS

| | | | |
|---|---|---|---|
| 2013/0234672 A1* | 9/2013 | Kubota | H01M 10/4207 320/134 |
| 2017/0125856 A1* | 5/2017 | Okada | H01M 10/425 |
| 2018/0045785 A1* | 2/2018 | Kodama | H01M 4/485 |
| 2018/0095137 A1 | 4/2018 | Yoshioka et al. | |
| 2018/0340980 A1 | 11/2018 | Roettinger | |
| 2019/0235596 A1* | 8/2019 | Lugo Beauchamp | G06F 1/28 |

FOREIGN PATENT DOCUMENTS

| | | |
|---|---|---|
| JP | 3559900 B2 | 9/2004 |
| JP | 2005-114401 A | 4/2005 |
| JP | 2013-51865 A | 3/2013 |
| JP | 2015-204217 A | 11/2015 |
| JP | 2018-57220 A | 4/2018 |
| JP | 6405942 B2 | 10/2018 |
| JP | 6555212 B2 | 8/2019 |
| KR | 10-1054757 B1 | 8/2011 |

OTHER PUBLICATIONS

Schober, Patrick MD, PhD, MMedStat; Boer, Christa PhD, MSc; Schwarte, Lothar A. MD, PhD, MBA Correlation Coefficients: Appropriate Use and Interpretation, Anesthesia & Analgesia: May 2018—vol. 126—Issue 5—p. 1763-1768 doi: 10.1213/ANE. 0000000000002864 (Year: 2018).*

Extended European Search Report for European Patent Application No. 20202914.6 dated Mar. 16, 2021.

* cited by examiner

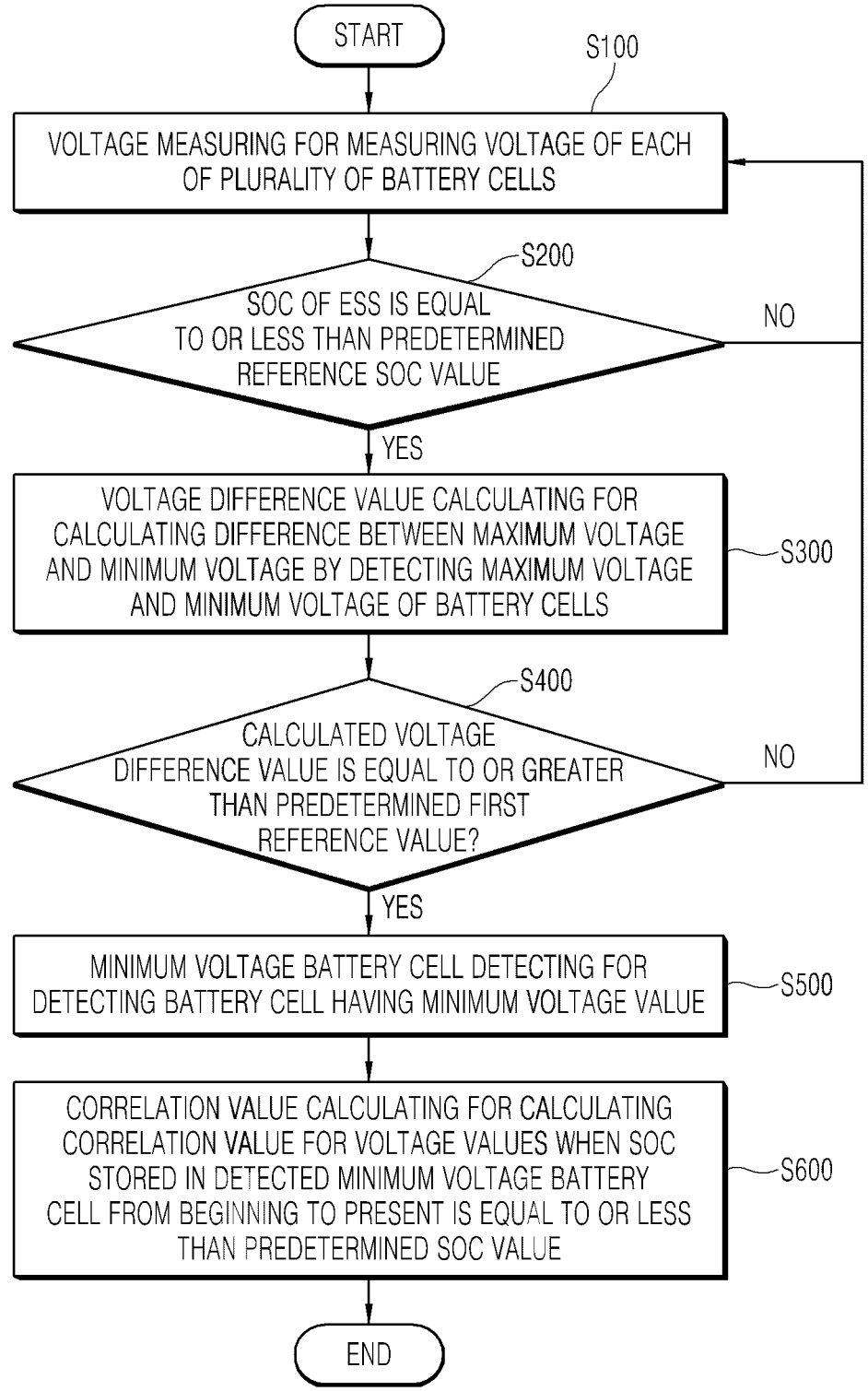

DEVICE AND METHOD FOR DETECTING POOR BATTERY CELL

CROSS-REFERENCE TO RELATED APPLICATION

This application claims priority to Korean Patent Application No. 10-2019-0171063 filed on Dec. 19, 2019 and all the benefits accruing therefrom under 35 U.S.C. § 119, the contents of which are incorporated by reference in their entirety.

BACKGROUND

The present disclosure relates to a device and a method for detecting a poor (e.g., defective) battery cell early in an energy storage system (ESS) composed of a plurality of battery cells.

A battery pack is an assembly composed of a number of components in which individual battery cells are welded and placed in a housing to assemble a module and then connected with bus bars and wires. In such a battery pack, a defect of a battery cell often occurs.

When a defect occurs in any one of battery cells constituting the battery pack, the corresponding battery cell is subjected to severe change of internal resistance (IR) during charging or discharging.

That is, in the charging state, a higher voltage is formed than in the case of a normal battery cell, and in the discharge state, a lower voltage is formed than in the case of the normal battery cell.

Meanwhile, when charging or discharging is repeatedly performed continuously even when there is a low-voltage poor battery cell, there is a problem in that the output of the entire battery pack is deteriorated.

In particular, in the case of an ESS in which a plurality of battery packs are connected and used, when there is one poor battery cell, and thus, the output of a battery pack including the one poor battery cell is reduced as described above, there is a problem in that the ESS is not efficiently used depending on the deviation from other battery packs of the ESS.

In addition, when the low-voltage poor battery cell is continuously charged or discharged, a short-circuit may occur in the poor battery cell, and when the short-circuit occurs, ignition and safety issues may occur.

Therefore, the present disclosure proposes a device and a method for detecting a poor cell early so that ignition and safety issues of an ESS due to poor cells do not occur.

PRIOR ART DOCUMENT

Patent Document (Patent Document 1) Japanese Patent Registration No. JP 6405942 B2

SUMMARY

The present disclosure provides a device and a method for detecting a poor battery cell early.

I In accordance with an exemplary embodiment, an ESS capable of detecting a poor (i.e., defective) battery cell in accordance with exemplary embodiments may be configured to include a plurality of battery cells, and a control unit programmed to control charging and discharging of the ESS, wherein the control unit may include an SOC calculation unit for calculating an SOC of the ESS, a voltage measurement sensor for measuring the voltage of each of the plurality of battery cells, and a poor battery cell detection unit for detecting a defective battery cell from the voltages measured in the voltage measurement sensor.

The poor battery cell detection unit includes a voltage difference value calculation unit for calculating a difference between a minimum voltage and a maximum voltage measured in the voltage measurement sensor, a minimum voltage battery cell detection unit for detecting a battery cell among the plurality of battery cells having the minimum voltage, and a correlation value calculation unit for calculating a correlation value for voltage values of the detected minimum voltage battery cell for a predetermined period of time, wherein the poor battery cell detection unit may determine whether the battery cell with the minimum voltage is defective based on the correlation value calculated by the correlation value calculation unit.

The voltage difference value calculation unit may calculate, w % ben the SOC value calculated by the SOC calculation unit is equal to or less than a predetermined SOC value, the difference between the minimum voltage and the maximum voltage measured by the voltage measurement sensor.

The minimum voltage battery cell detection unit may detect, when the difference between the minimum voltage and the maximum voltage measured by the voltage measurement sensor is equal to or greater than a predetermined first reference value, the battery cell having the minimum voltage.

The correlation value calculation unit may calculate a correlation value by performing correlation analysis on voltage values when the SOC value calculated by the SOC calculation unit is equal to or less than the predetermined SOC value among voltage values recorded in the detected battery cell having the minimum voltage for the predetermined period of time.

The poor battery cell detection unit may detect a battery cell having the minimum voltage as a defective battery cell when the calculated correlation value is equal to or greater than a predetermined second reference value.

In accordance with another exemplary embodiment, a method for detecting a poor battery cell in an ESS including a plurality of battery cells may include a voltage measuring step including measuring the voltage of each of the plurality of battery cells and a poor battery cell detecting step including detecting a defective battery cell among the plurality of battery cells based on the measured voltage of each of the battery cells.

The poor battery cell detection step may include a voltage difference value calculating step including calculating the difference between a maximum voltage and a minimum voltage by detecting a maximum voltage and a minimum voltage of each of the battery cells when the SOC of the ESS is equal to or less than a predetermined reference SOC value, a minimum voltage battery cell detecting step for detecting a battery cell having the minimum voltage value when the calculated voltage difference value is equal to or greater than a predetermined first reference value, a correlation value calculating step including calculating a correlation value for voltage values when an SOC recorded in the detected battery cell having the minimum voltage for the predetermined period of time is equal to or less than a predetermined SOC value, and a defect determining step including determining whether battery cell production is defective on the basis of the calculated correlation value.

The correlation value calculation step may calculate a correlation value by performing correlation analysis on voltage values when the SOC value calculated by the SOC calculation unit is equal to or less than the predetermined SOC value among voltage values recorded in the detected minimum voltage battery cell for the predetermined period of time.

The poor battery cell detection step may detect the battery cell having the minimum voltage as a defective battery cell when the calculated correlation value is equal to or greater than a predetermined second reference value.

BRIEF DESCRIPTION OF THE DRAWINGS

Exemplary embodiments can be understood in more detail from the following description taken in conjunction with the accompanying drawings, in which:

FIG. 2 is a flowchart showing a method for detecting a poor cell in accordance with an exemplary embodiment.

DETAILED DESCRIPTION OF EMBODIMENTS

Figure 1:
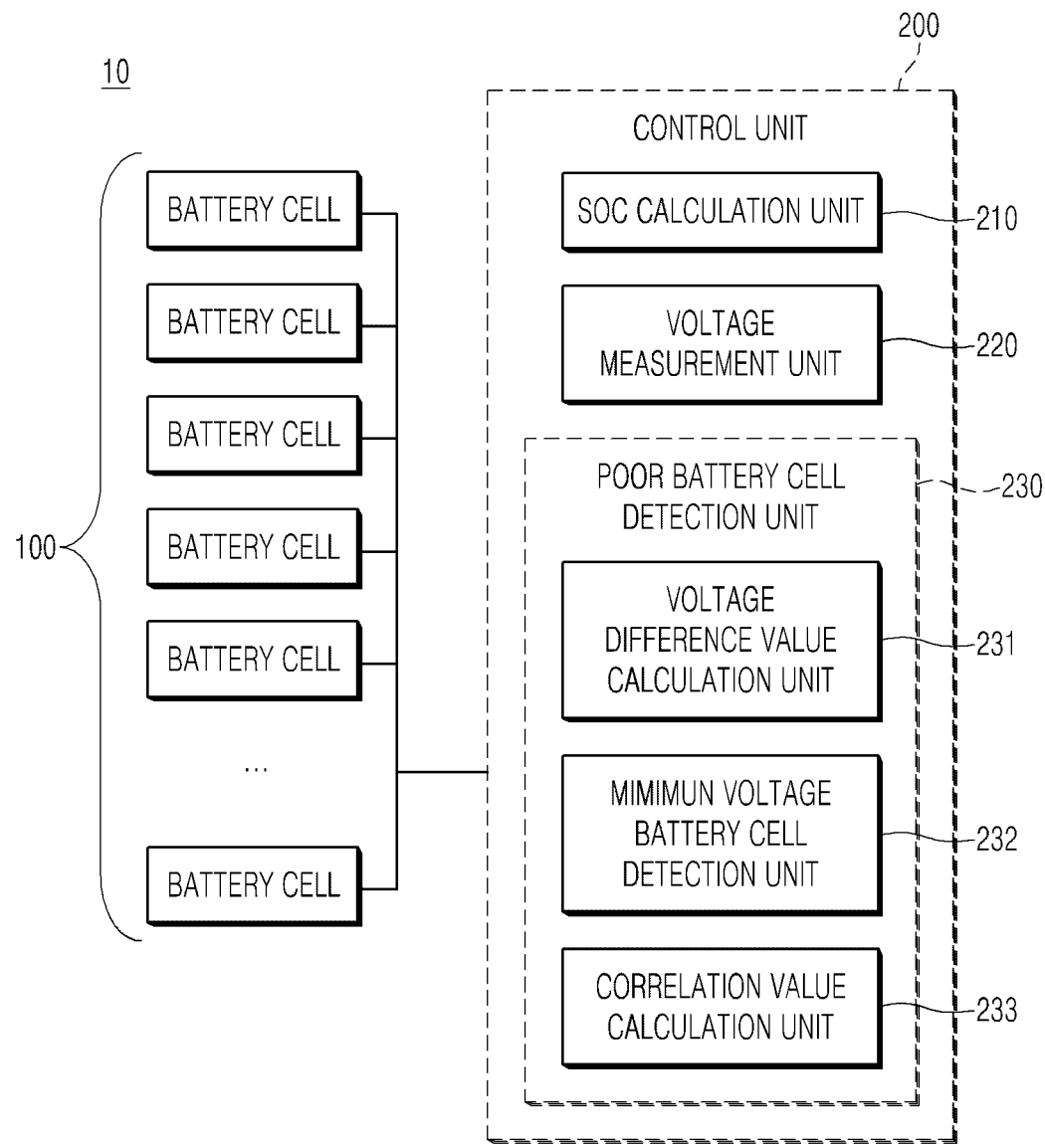
FIG. 1 is a view showing the configuration of an ESS capable of detecting a poor cell in accordance with an exemplary embodiment.

Hereinafter, embodiments of the present invention will be described in detail with reference to the accompanying drawings so that those skilled in the art to which the present invention pertains may easily practice the embodiments. However, the present invention may be embodied in many different forms, and is not limited to the embodiments set forth herein. In addition, in order to clearly describe the present invention, parts irrelevant to the description are omitted in the drawings, and like reference numerals designate like elements throughout the specification.

It will be understood that, although the terms including ordinal numbers such as first and second may be used herein to describe various elements, these elements should not be limited by these terms. The terms are used only for the purpose of distinguishing one component from another. For example, a first element could be termed a second element, and, similarly, a second element could be termed a first element, without departing from the scope of example the inventive concept. The terms used in the present application are only used to describe specific embodiments, and are not intended to limit the present invention. The terms of a singular form may include a plural form unless the context clearly indicates otherwise.

Throughout the present specification, when a part is referred to as being "connected" to another part, it includes not only the case of "being directly connected," but also the case of "being electrically connected" having another element therebetween. In addition, when a portion is said to 'include' any component, it means that the portion may further include other components rather than excluding the other components unless otherwise stated. The term "a step (~ing)," or "a step of~," as used throughout the present specification, does not mean "a step for."

The terms used in the present invention are general terms which are currently widely used and selected while considering the functions of the present invention, but this may vary according to the intention of a person skilled in the art or the appearance of precedents and new technologies. In addition, in certain cases, there are also terms selected by the applicant arbitrarily, in which case the meanings thereof will be described in detail in the corresponding description of the present invention. Therefore, the terms used in the present invention should be defined on the basis of the meaning of the terms and the entire contents of the present invention, rather than the simple name of a term.

1. ESS Capable of Detecting Poor Battery Cell in Accordance with Exemplary Embodiment The present disclosure relates to a device for detecting a poor battery cell in an ESS composed of a plurality of battery cells, the device capable of detecting a poor battery cell early, thereby enabling the safe use of the ESS.

FIG. 1 is a view showing the configuration of an ESS 10 capable of detecting a poor cell in accordance with an exemplary embodiment.

Hereinafter, the ESS capable of detecting a poor battery cell in accordance with an exemplary embodiment will be described with reference to FIG. 1.

The ESS 10 capable of detecting a poor battery cell in accordance with an exemplary embodiment is configured to include a plurality of battery cells 100 and a control unit 200 for controlling the charge/discharge of the ESS 10.

1) Control Unit 200

The control unit 200 may be configured to include an SOC calculation unit 210 for calculating the SOC of the ESS 10, a voltage measurement unit 220 for measuring the voltage of each of the plurality of battery cells, and a poor battery cell detection unit 230 for detecting a poor battery cell from the voltage measured by the voltage measurement unit 220.

1-1) SOC Calculation Unit 210

The SOC calculation unit 210 may calculate the SOC of each of the plurality of battery cells 100 using SOC calculation techniques of various manners known in the art such as a current integration method, an SOC calculation method on the basis of OCV and the like.

The calculated SOC of each of the plurality of battery cells 100 is transmitted to the poor battery cell detection unit 230.

1-2) Voltage Measurement Unit 220

The voltage measurement unit 220 measured the voltage of each battery cell and transmit the measured voltage to the poor battery cell detection unit 230 to be described layer.

1-3) Poor Battery Cell Detection Unit 230

The poor battery cell detection unit 230 may be configured to include a voltage difference value calculation unit 231 for calculating the difference between the minimum voltage and the maximum voltage among voltages received from the voltage measurement unit, a minimum voltage battery cell detection unit 232 for detecting a battery cell having the minimum voltage, and a correlation value calculation unit 233 for calculating a correlation value for voltage values of the detected minimum voltage battery cell from the beginning to the present.

In addition, the poor battery cell detection unit 230 may determine whether the minimum voltage battery cell is poor on the basis of the correlation value calculated by the correlation value calculation unit 233.

1-3-1) Voltage Difference Value Calculation Unit 231

It is preferable that the voltage difference value calculation unit 231 calculates the difference between the minimum voltage and the maximum voltage among voltages received from the voltage measurement unit when the SOC value received from the SOC calculation unit is equal to or less than a predetermined SOC value.

For example, the predetermined SOC value may be a low SOC value of SOC 10%. The reason for measuring the voltage difference at a low SOC value of the ESS as described above is that the voltage gap between battery cells in a low SOC region is wider compared to a relatively high SOC region. Meanwhile. SOC 10% which has been taken for an example is only exemplary and is not limited thereto.

A higher or lower SOC may be set to a predetermined SOC value according to the accuracy and determination timing of poor battery cell detection.

1-3-2) Minimum Voltage Battery Cell Detection Unit 232

The minimum voltage battery cell detection unit 232 may detect a battery cell having the minimum voltage when the difference between the minimum voltage and the maximum voltage measured by the voltage measurement unit is equal to or greater than a predetermined first reference value.

The predetermined first reference value is a value set under the assumption that an error occurs in the process of measuring an SOC. For example, if the error of an SOC is assumed to be 3%, the predetermined first reference value is 0.6 because it is difficult for the voltage difference between battery cells to be greater than 0.6 V based on an OCV table.

However, an exemplary embodiment is not limited thereto. The predetermined first reference value may be adjusted according to the specification of the ESS and an error range allowed in SOC calculation.

1-3-3) Correlation Value Calculation Unit 233

The correlation value calculation unit 233 calculates a first correlation value by performing correlation analysis on voltage values when the SOC value calculated by the SOC calculation unit is equal or less than the predetermined SOC value among voltage values recorded in the detected minimum voltage battery cell from the beginning to the present.

For example, Pearson technique may be used for the correlation analysis for calculating a correlation value in the correlation value calculation unit. The Pearson technique may calculate a correlation value on the basis of the following (Equation 1).

$$\rho = \frac{\sum XY - \frac{\sum X \sum Y}{N}}{\sqrt{\left(\sum X^2 - \frac{(\sum X)^2}{N}\right)\left(\sum Y^2 - \frac{(\sum Y)^2}{N}\right)}}$$ (Equation 1)

((However, X is voltage, Y is time, N is the number of cells)

Table 1 below is an example of the correlation between X and Y for the correlation value (ρ) calculated by Pearson technique.

TABLE 1

| Correlation value (ρ) | Correlation between X and Y |
| --- | --- |
| −1 | perfect negative |
| (−1, −0.75) | strong negative |
| (−0.75, −0.5) | moderate negative |
| (−0.5, −0.25) | weak negative |
| (−0.25, 0.25) | no linear association |
| (0.25, 0.5) | weak positive |
| (0.5, 0.75) | moderate positive |
| (0.75, 1) | strong positive |
| 1 | perfect positive |

Specifically, among voltage values recorded in the detected minimum voltage battery cell from the beginning to the present, if the first associated value (p) which has been calculated using voltage values when the SOC value calculated by the SOC calculation unit is equal or less than the predetermined SOC value and detection time is 0.79, since 0.79 in the above table corresponds to strong positive (strong proportional relationship), the corresponding battery cell may be more likely to become a poor battery cell over time.

Meanwhile, in the present disclosure, only the Pearson technique has been taken for an example of calculating a correlation value by performing correlation analysis. However, various methods may be used for calculating a correlation value for voltage values when the SOC value calculated by the SOC calculation unit is equal or less than the predetermined SOC value among voltage values recorded in the detected minimum voltage battery cell from the beginning to the present.

Meanwhile, the correlation value calculation unit 233 may calculate a second correlation value which is different from the first correlation value described above.

For example, the correlation value calculation unit 233 may calculate the second correlation value by performing correlation analysis on the voltage value of the detected minimum voltage battery cell and voltage values of remaining cells except for the detected minimum voltage battery cell.

The Pearson technique described above may be also used as a method for calculating the second correlation value.

Specifically, when correlation analysis is performed on the voltage value of the detected minimum voltage battery cell and voltage values of remaining cells except for the detected minimum voltage battery cell using the Pearson technique, a second correlation value is calculated in which the voltage value of the minimum voltage battery cell is correlated with the voltage of another battery cell.

When the calculated second correlation value is large, it means that the voltage value of the detected minimum voltage battery cell is similar to those of other battery cells, and thus, the possibility of being a poor battery is low.

Meanwhile, when the calculated second correlation value is small, it means that the difference between the voltage value of the detected minimum voltage battery cell and those of other battery cells is large, and thus, the possibility that the detected minimum voltage battery cell is a poor battery is high.

Meanwhile, the poor battery cell detection unit may determine a battery cell having the minimum voltage as a poor battery cell when the calculated first correlation value is equal to or greater than a predetermined second reference value.

For example, the predetermined second reference value may be determined to be 0.75 referring Table 1 above. Specifically, a case of 0.75 or greater in Table 1 above corresponds to strong positive (strong proportional relationship) or perfect positive (perfect proportional relationship), so that it means that the corresponding battery cell may be highly likely to become a poor battery cell. However, the above value of 0.75 is only an exemplary value is not limited thereto. The value may be set to various values according to the specification of the ESS and the accuracy of poor battery cell detection.

As another example, the poor battery cell detection unit may determine a battery cell having the minimum voltage as a poor battery cell when the calculated first correlation value is equal to or greater than the predetermined second reference value and the calculated second correlation value is equal to or less than a predetermined third reference value.

In other words, if the second correlation value is equal to or less than a third reference value under an and condition with the first reference value described above, it is possible to determine a battery cell having the detected minimum voltage as a poor battery cell.

Meanwhile, the ESS capable of detecting a poor battery cell may be configured to further include a notification unit to inform the outside of a poor battery cell, when the poor battery cell detection unit detects that there is a poor battery cell.

2: Method for Detecting Poor Battery Cell in Accordance with an Exemplary Embodiment FIG. 2 is a flowchart showing a method for detecting a poor cell in accordance with an exemplary embodiment.

Hereinafter, the method for detecting a poor battery cell in accordance with an exemplary embodiment will be described with reference to FIG. 2.

The method for detecting a poor battery cell in accordance with an exemplary embodiment may include a voltage measuring step S100 for measuring the voltage of each of the plurality of battery cells and poor battery cell detecting steps S200 to S600 for detecting a poor battery cell on the basis of the measured voltage of each of the battery cells.

Specifically, the poor battery cell detection step may include a voltage difference value calculating step S300 for calculating the difference between the maximum voltage and the minimum voltage by detecting the maximum voltage and the minimum voltage of battery cells when the SOC of the ESS is equal to or less than a predetermined reference SOC value S200, a minimum voltage battery cell detecting step S500 for detecting a battery cell having the minimum voltage value when the calculated voltage difference value is equal to or greater than a predetermined first reference value S400, a correlation value calculating step S600 for calculating a correlation value voltage values when an SOC recorded in the detected minimum voltage battery cell from the beginning to the present is equal to or less than a predetermined SOC value, and a defect determining step for determining whether battery cell production is poor on the basis of the calculated correlation value.

Meanwhile, in the voltage difference value calculation step S300, the predetermined SOC value may be a low SOC value of SOC 10%. The reason for measuring the voltage difference at a low SOC value of the ESS as described above is that the voltage gap between battery cells in a low SOC region is wider compared to a relatively high SOC region. Meanwhile, SOC 10% which has been taken for an example is only exemplary and is not limited thereto. A higher or lower SOC may be set to a predetermined SOC value according to the accuracy and determination timing of poor battery cell detection.

Meanwhile, in the minimum voltage battery cell detection step S500, the predetermined first reference value is a value set under the assumption that an error occurs in the process of measuring an SOC. For example, if the error of an SOC is assumed to be 3%, the predetermined first reference value is 0.6 because it is difficult for the voltage difference between battery cells to be greater than 0.6 V based on an OCV table.

However, an exemplary embodiment is not limited thereto. The predetermined first reference value may be adjusted according to the specification of the ESS and an error range allowed in SOC calculation.

Meanwhile, the correlation value calculating step may calculate a correlation value for the detected minimum voltage battery cell.

For example, among voltage values recorded in the detected minimum voltage battery cell from the beginning to the present, a first correlation value may be calculated for voltage values when the SOC value calculated by the SOC calculation unit is equal or less than the predetermined SOC value. A technique for calculating a correlation value in the correlation value calculation unit may be the Pearson technique. The Pearson technique may calculate a correlation value through the following (Equation 1).

$$\rho = \frac{\sum XY - \frac{\sum X \sum Y}{N}}{\sqrt{\left(\sum X^2 - \frac{(\sum X)^2}{N}\right)\left(\sum Y^2 - \frac{(\sum Y)^2}{N}\right)}} \quad \text{(Equation 1)}$$

((However, X is voltage, Y is time, N is the number of cells)

Table 2 below is an example of the correlation between X and Y for the correlation value (ρ) calculated by Pearson technique.

TABLE 2

| Correlation value (ρ) | Correlation between X and Y |
| --- | --- |
| −1 | perfect negative |
| (−1, −0.75) | strong negative |
| (−0.75, −0.5) | moderate negative |
| (−0.5, −0.25) | weak negative |
| (−0.25, 0.25) | no linear association |
| (0.25, 0.5) | weak positive |
| (0.5, 0.75) | moderate positive |
| (0.75, 1) | strong positive |
| 1 | perfect positive |

Specifically, among voltage values recorded in the detected minimum voltage battery cell from the beginning to the present, if a correlation value (p) which has been calculated using voltage values when the SOC value calculated by the SOC calculation unit is equal or less than the predetermined SOC value and detection time is 0.79, since 0.79 in the above table corresponds to strong positive proportional relationship, the corresponding battery cell may be more likely to become a poor battery cell over time.

Meanwhile, in the present disclosure, only the Pearson technique has been taken for an example of a step of calculating a correlation value. However, various methods may be used for calculating a correlation value for voltage values when the SOC value calculated by the SOC calculation unit is equal or less than the predetermined SOC value among voltage values recorded in the detected minimum voltage battery cell from the beginning to the present.

As another example, the correlation value calculation step may be configured to include a second correlation value calculating step for calculating a second correlation value by performing correlation analysis on the voltage value of the detected minimum voltage battery cell and voltage values of remaining cells except for the detected minimum voltage battery cell.

The Pearson technique described above may be also used as a method for calculating the second correlation value.

Specifically, when correlation analysis is performed on the voltage value of the detected minimum voltage battery cell and voltage values of remaining cells except for the detected minimum voltage battery cell using the Pearson technique, a second correlation value is calculated in which the voltage value of the minimum voltage battery cell is correlated with the voltage of another battery cell.

When the calculated second correlation value is large, it means that the voltage value of the detected minimum voltage battery cell is similar to those of other battery cells, and thus, the minimum voltage battery cell has low possibility of being a poor or defected battery cell.

Meanwhile, when the calculated second correlation value is small, it means that the difference between the voltage value of the detected minimum voltage battery cell and those of other battery cells is large, and thus, the possibility that the detected minimum voltage battery cell is a poor battery cell is high.

Meanwhile, the poor battery cell detection step may determine a battery cell having the minimum voltage a poor battery cell when the calculated first correlation value is equal to or greater than a predetermined second reference value.

For example, the predetermined second reference value can be set up arbitrarily as explained above and not limited thereto and may be set to various values according to the specification of the ESS and the accuracy of poor battery cell detection.

As another example, the poor battery cell detection step may determine a battery cell having the minimum voltage as a poor battery cell when the calculated first correlation value is equal to or greater than the predetermined second reference value and the calculated second correlation value is equal to or less than a predetermined third reference value.

In other words, if the second correlation value is equal to or less than a third reference value under an "and" condition with the first reference value described above, it is possible to determine a battery cell having the detected minimum voltage as a poor battery cell.

Meanwhile, the method for detecting a poor battery cell may be configured to further include a notification step for notifying the outside of a poor battery cell w % ben a poor battery cell is detected in the poor battery cell detection step.

An exemplary embodiment is capable of detecting a poor battery cell early.

In addition, by detecting a poor battery cell early, the exemplary embodiment is capable of preventing ignition and safety issues of an energy storage system Meanwhile, although the technical spirit of the present invention has been described in detail according to the above embodiment, it should be noted that the above embodiment is for the description thereof, and is not intended to limit the same. In addition, those skilled in the art will understand that various embodiments are possible within the scope of the technical spirit of the present invention.

What is claimed is:

1. An energy storage system (ESS) comprising:
a plurality of battery cells;
a control unit programmed to control charging and discharging of the ESS, wherein the control unit includes:
an SOC calculation unit for calculating a state of charge (SOC) of the ESS;
a voltage measurement sensor for measuring voltage of each of the plurality of battery cells; and
a poor battery cell detection unit for detecting a defective battery cell among the plurality of battery cells from the voltages measured by the voltage measurement sensor, the poor battery cell detection unit including:
a voltage difference value calculation unit for calculating, when a SOC value calculated by the SOC calculation unit is equal to or less than a predetermined SOC value of 10%, a difference between a minimum voltage and a maximum voltage measured by the voltage measurement sensor;
a minimum voltage battery cell detection unit for detecting a battery cell among the plurality of battery cells having the minimum voltage when the difference between the minimum voltage and the maximum voltage is equal to or greater than a predetermined first reference value; and
a correlation value calculation unit for calculating a correlation value for voltage values of only the detected minimum voltage battery cell for a predetermined period of time,
wherein the poor battery cell detection unit determines whether the minimum voltage battery cell with the minimum voltage is defective when the correlation value calculated by the correlation value calculation unit is equal to or greater than a predetermined second reference value,
wherein the correlation value calculation unit calculates a first correlation value by performing correlation analysis on voltage values when the SOC value calculated by the SOC calculation unit is equal to or less than the predetermined SOC value among voltage values recorded in the detected battery cell having the minimum voltage for the predetermined period of time, using the following Equation:

$$\rho = \frac{\sum XY - \frac{\sum X \sum Y}{N}}{\left(\sum X^2 - \frac{(\sum X)^2}{N}\right)\left(\sum Y^2 - \frac{(\sum Y)^2}{N}\right)}$$

where ρ is the first correlation value, where X is voltage, Y is time and N is the number of cells,
wherein the first correlation value is between −1, which represents a perfect negative correlation and +1, which represents a perfect positive correlation,
wherein the poor battery cell detection unit determines that the battery cell having the minimum voltage is defective when the first correlation value is equal to or greater than the predetermined second reference value and a second correlation value is equal to or less than a predetermined third reference value,
wherein the first correlation value is different than the second correlation value, and
wherein the predetermined first reference value is a value set based on an expected error rate in the calculation of the SOC.

2. The ESS of claim 1, wherein the correlation value calculation unit calculates the second correlation value by performing correlation analysis on the voltage value of the detected battery cell having the minimum voltage and voltage values of remaining cells except for the detected minimum voltage battery cell.

3. The ESS of claim 1, wherein the predetermined first reference value is less than or equal to 0.6 V.

4. The ESS of claim 1, wherein the predetermined second reference value is approximately 0.75.

5. A method for detecting a poor battery cell in energy storage system (ESS) comprising a plurality of battery cells, the method comprising:
a voltage measuring step including measuring voltage of each of the plurality of battery cells; and
a poor battery cell detecting step including:
detecting a defective battery cell among the plurality of battery cells based on the measured voltage of each of the battery cells;
a voltage difference value calculating step including calculating a difference between a maximum voltage and a minimum voltage by detecting a maximum voltage and a minimum voltage of each of the battery cells when a SOC of the ESS is equal to or less than a predetermined SOC value of 10%;

a minimum voltage battery cell detecting step including detecting a battery cell among the plurality of battery cells having the minimum voltage value when the calculated voltage difference value is equal to or greater than a predetermined first reference value;

a correlation value calculating step including calculating a correlation value for only the detected battery cell having the minimum voltage; and a defect determining step including determining whether battery cell production is defective when the calculated correlation value is equal to or greater than a predetermined second reference value, wherein the correlation value calculating step comprises a first correlation value calculating step including calculating a first correlation value by performing correlation analysis on voltage values when the SOC value is equal to or less than the predetermined SOC value among voltage values recorded in the detected battery cell having the minimum voltage for a predetermined period of time, using the following Equation:

$$\rho = \frac{\sum XY - \frac{\sum X \sum Y}{N}}{\sqrt{\left(\sum X^2 - \frac{(\sum X)^2}{N}\right)\left(\sum Y^2 - \frac{(\sum Y)^2}{N}\right)}}$$

where $\rho$ is the first correlation value, where X is voltage, Y is time and N is the number of cells, wherein the first correlation value is between −1, which represents a perfect negative correlation and +1, which represents a perfect positive correlation, wherein the defect determining step detects the battery cell having the minimum voltage as the defective battery cell when the first correlation value is equal to or greater than the predetermined second reference value and a second correlation value is equal to or less than a predetermined third reference value, wherein the first correlation value is different than the second correlation value, and wherein the predetermined first reference value is a value set based on an expected error rate in calculating the SOC.

6. The method of claim 5, wherein the correlation value calculating step comprises a second correlation value calculating step including calculating the second correlation value by performing correlation analysis on the voltage values of the detected battery cell having the minimum voltage and voltage values of remaining cells except for the battery cell having the minimum voltage.

7. The method of claim 5, wherein the predetermined first reference value is less than or equal to 0.6 V.

8. The method of claim 5, wherein the predetermined second reference value is approximately 0.75.

* * * * *